(12) United States Patent
Choi et al.

(10) Patent No.: US 10,256,823 B2
(45) Date of Patent: *Apr. 9, 2019

(54) CLOCK GENERATION CIRCUIT

(71) Applicant: SK hynix Inc., Gyeonggi-do (KR)

(72) Inventors: Hae-Rang Choi, Gyeonggi-do (KR); Yong-Ju Kim, Gyeonggi-do (KR); Dae-Han Kwon, Gyeonggi-do (KR); Shin-Deok Kang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/106,658

(22) Filed: Aug. 21, 2018

(65) Prior Publication Data

US 2018/0358972 A1    Dec. 13, 2018

Related U.S. Application Data

(63) Continuation of application No. 14/793,451, filed on Jul. 7, 2015, now Pat. No. 10,079,606.

(30) Foreign Application Priority Data

Mar. 9, 2015 (KR) ........................ 10-2015-0032591

(51) Int. Cl.
*H03D 3/24* (2006.01)
*H03K 23/66* (2006.01)
*G06F 1/04* (2006.01)

(52) U.S. Cl.
CPC ............. *H03K 23/662* (2013.01); *G06F 1/04* (2013.01)

(58) Field of Classification Search
CPC ................................. H03K 23/662; G06F 1/04
USPC ......................................................... 375/375
See application file for complete search history.

(56) References Cited

U.S. PATENT DOCUMENTS

2005/0286672 A1\* 12/2005 Lin .................... H03K 5/15013
375/376

\* cited by examiner

*Primary Examiner* — Tanmay K Shah
(74) *Attorney, Agent, or Firm* — IP & T Group LLP

(57) ABSTRACT

A clock generation circuit includes a clock generation unit suitable for generating a first clock, a first inversion clock having an opposite phase to the first clock, a second clock having a different phase from the first clock, and a second inversion clock having an opposite phase to the second clock; and a reset control unit suitable for comparing the phases of the first and second clocks, and controlling the clock generation unit to disable for a time and then enable the second clock and the second inversion clock when the second clock leads the first clock.

10 Claims, 11 Drawing Sheets

US 10,256,823 B2

CLOCK GENERATION CIRCUIT

CROSS-REFERENCE TO RELATED APPLICATIONS

This application is a continuation of U.S. Patent Application Ser. No. 14/793,451 filed on Jul. 7, 2015, which claims priority of Korean Patent Application No. 10-2015-0032591, filed on Mar. 9, 2015. The disclosure of each of the foregoing applications is incorporated herein by reference in its entirety.

BACKGROUND

1. Field

Exemplary embodiments of the present invention relate to a clock generation circuit.

2. Description of the Related Art

As the operation speed of an integrated circuit increases, clocking power consumption and speed bottlenecking become serious issues. In order to solve such problems, the integrated circuit operates at low clock speed and only the I/O circuit operates at high speed. Additionally, the integrated circuit uses multiple internal clocks having multiple phases.

For example, four internal clocks, each of which has a phase difference of 90°, are generated from an external clock. Conducting internal operations using four internal clocks that operate at low-speed alleviates the internal operation speed problems, while the I/O operation speed is still high. The I/O operations are conducted by serialization of the four internal clocks at the input and output of the internal circuit.

The internal clocks having multiple phases can be made by generating two internal clocks having phases of 0° and 90° and generating two internal clocks having phases of 180° and 270°, which are inverted versions of the two former internal clocks. That is, a pair of the internal clocks having phases of 0° and 180° are generated, and the other pair of the internal clocks having phases of 90° and 270° are generated. The phase relationship between the internal clocks should be always maintained.

FIG. 1 is a diagram illustrating a clock generation circuit for generating internal clocks CK1 to CK4 having four difference phases. In FIG. 1, each phase difference among the internal clocks CK1 to CK4 is 90°.

Referring to FIG. 1, the clock generation circuit may include D flip-flops DFF1 and DFF2 and inverters I1 and I2.

The first D flip-flop DFF1 may output a value of an input node D to an output node Q at the rising edge of a reference clock CK. When a reset signal RSTB is enabled, the first D flip-flop DFF1 may low-disable the signal of the output node Q. The output signal of the first D flip-flop DFF1 may be inverted by the inverter I1 and input to the input node D of the first D flip-flop DFF1. In this case, a clock output from the output node Q of the first D flip-flop DFF1 may be the first clock CK1 having a phase of 0°, and a clock input to the input node D of the first D flip-flop DFF1 may be the third clock CK3 having a phase of 180°.

The second D flip-flop DFF2 may output a value of an input node D to an output node Q at the rising edge of a reference inversion clock CKB. The reference inversion clock CKB may have the opposite phase to the clock CK. When the reference reset signal RSTB is enabled, the second D flip-flop DFF2 may low-disable the signal of the output node Q. The signal output to the output node Q of the second D flip-flop DFF2 may be inverted by the inverter I2 and input to the input node D of the second D flip-flop DFF2. In this case, a clock output from the output node Q of the second D flip-flop DFF2 may be the second clock CK2 having a phase of 90°, and a clock input to the input node D may be the fourth clock CK4 having a phase of 270°.

In order for the integrated circuit to operate, the first to fourth clocks CK1 to CK4 generated by the clock generation circuit of FIG. 1 need to have a constant phase relationship.

FIG. 2 is a diagram illustrating problems which may occur in the clock generation circuit of FIG. 1.

As illustrated in FIG. 2, it is assumed that at time point A the duty ratios of the reference clock CK and the reference inversion clock CKB are distorted due to noise generated in the integrated circuit. The distortion makes the first clock CK1 fail to toggle at time point T1, when it is supposed to. However, the second clock CK2 has shifted properly at time point T2, and thus the first to fourth clocks CK1 to CK4 have mismatched phase relationships as illustrated in FIG. 2. That is, the first to fourth clocks CK1 to CK4 have phases of 90°, 270°, 0°, and 180°. With the internal clocks CK1 to CK4 having mismatched phase relationships, the integrated circuit cannot operate properly.

SUMMARY

Various embodiments are directed to a clock generation circuit capable of recovering phase relationships among multiple-phase clocks when the phase relationship is distorted.

In an embodiment, a clock generation circuit may include a clock generation unit suitable for generating a first clock, a first inversion clock having an opposite phase to the first clock, a second clock having a different phase from the first clock, and a second inversion clock having an opposite phase to the second clock; and a reset control unit suitable for comparing the phases of the first and second clocks, and controlling the clock generation unit to disable for a time and then enable the second clock and the second inversion clock when the second clock leads the first clock.

In an embodiment, a clock generation circuit may include a first clock generation unit suitable for generating a first clock and a first inversion clock having an opposite phase to the first clock, disabling the first clock and the first inversion clock when a first reset signal is enabled, and enabling the first clock and the first inversion clock when the first reset signal is disabled; a second clock generation unit suitable for generating a second clock having a different phase from the first clock and a second inversion clock having an opposite phase to the second clock, disabling the second clock and the second inversion clock when a second reset signal is enabled, and enabling the second clock and the second inversion clock when the second reset signal is disabled; a detection signal generation unit suitable for generating a detection signal by detecting a logic value of either the second clock or the second inversion clock at an edge of the first clock; and a reset signal generation unit suitable for generating the first reset signal in response to a reference reset signal, and generating the second reset signal in response to the first reset signal while the detection signal is enabled.

In an embodiment, a clock generation circuit may include a first D flip-flop suitable for outputting a signal input through a first input node to a first output node at an edge of a reference clock when a first reset signal is disabled, inverting the signal of the first output node, and feeding the inverted signal back to the first input node; a second D flip-flop suitable for outputting a signal input through a second input node to a second output node at an edge of a reference inversion clock having an opposite phase to the reference clock when a second reset signal is disabled, inverting the signal of the second output node, and feeding the inverted signal back to the second input node; a third D flip-flop suitable for outputting either the signal of the second input node or the signal of the second output node as a detection signal at an edge of the signal of the first output node when a reference reset signal is disabled; and a fourth D flip-flop suitable for outputting the first reset signal as the second reset signal at an edge of the reference clock while the signal of the first output node has a predetermined logic value when the detection signal is disabled.

In an embodiment, a clock generation circuit may include a clock generation unit suitable for generating a first clock, a first inversion clock having an opposite phase to the first clock, a second clock having a different phase from the first clock, and a second inversion clock having an opposite phase to the second clock; a phase comparison unit suitable for comparing the phases of the first and second clocks; and a clock transfer unit suitable for transferring the first clock, the second clock, the first inversion clock, and the second inversion clock as first to fourth output clocks in accordance with a relationship based on the comparison result.

In an embodiment, a clock generation circuit may include a first clock generation unit suitable for generating a first clock by dividing a reference clock by 2 and generating a first inversion clock by inverting the first clock; a second clock generation unit suitable for generating a second clock by dividing a reference inversion clock, which has an opposite phase to the reference clock, by 2 and generating a second inversion clock by inverting the second clock; a detection unit suitable for detecting a logic values of either the second clock or the second inversion clock at an edge of the first clock; and a clock transfer unit suitable for transferring the first clock, the second clock, the first inversion clock, and the second inversion clock as first to fourth output clocks in accordance with a relationship based on the comparison result.

DETAILED DESCRIPTION

Figure 1:
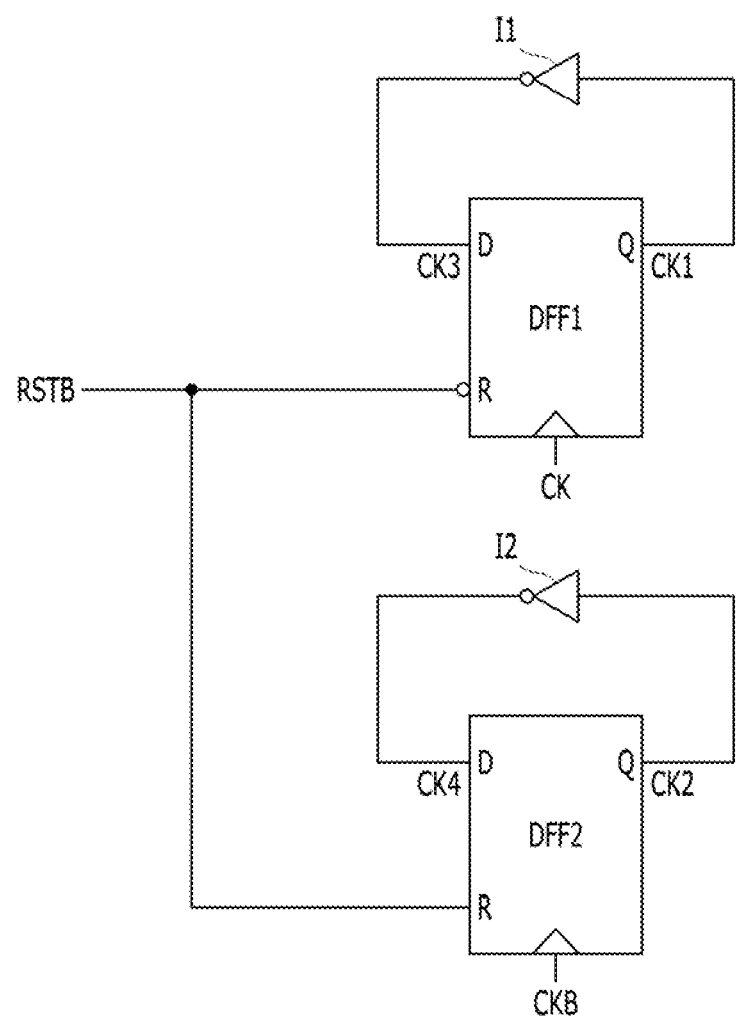
FIG. 1 is a diagram illustrating a clock generation circuit for generating internal clocks having four difference phases.
Figure 2:
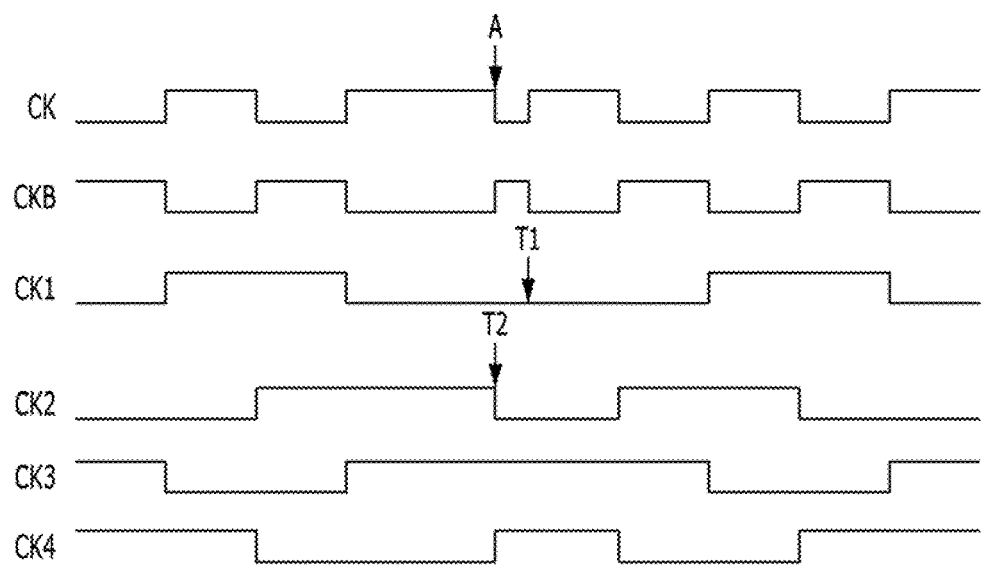
FIG. 2 is a diagram illustrating problems which may occur in the clock generation circuit of FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
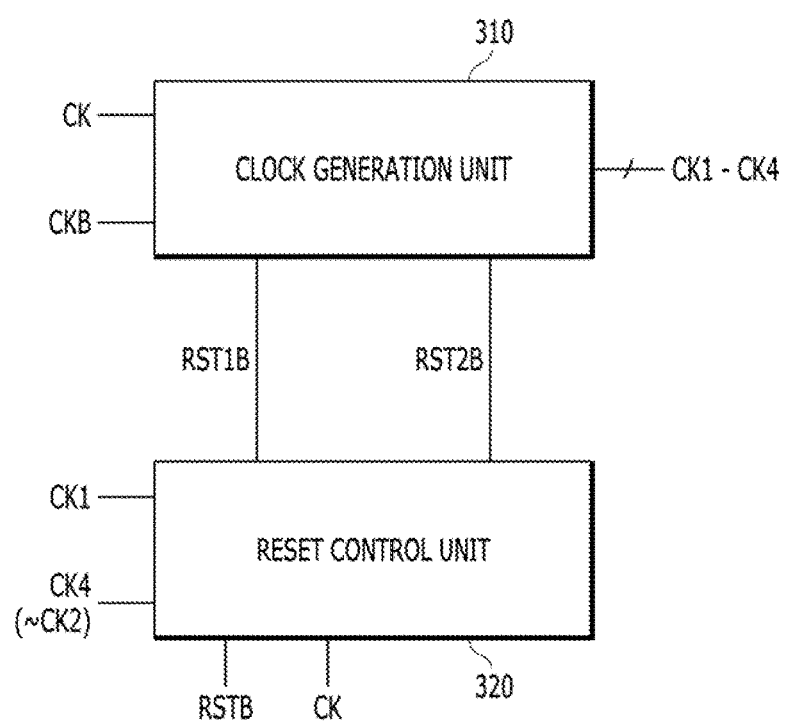
FIG. 3 is a configuration diagram illustrating a clock generation circuit in accordance with an embodiment of the present invention.

FIG. 3 is a configuration diagram illustrating a clock generation circuit in accordance with an embodiment of the present invention.

Referring to FIG. 3, the clock generation circuit may include a clock generation unit 310 and a reset control unit 320.

The clock generation unit 310 may generate a first clock CK1 and a first inversion clock CK3 in response to a reference clock CK, and generate a second clock CK2 and a second inversion clock CK4 in response to a reference inversion clock CKB having the opposite phase of the reference clock CK. Each pair of the first and the second clocks CK1 and CK2 and the first and the second inversion clocks CK3 and CK4 may have a phase difference of 90°. The first clock CK1 may have a phase of 0°, the second clock CK2 may have a phase of 90°, the first inversion clock CK3 may have a phase of 180°, and the second inversion clock CK4 may have a phase of 270°.

The first clock CK1 may be generated by dividing the reference clock CK by 2, and the second clock CK2 may be generated by dividing the reference inversion clock CKB by 2. Through the 2-divisions, the first and second clocks CK1 and CK2 may have half the frequency and doubled the period of the reference and reference inversion clocks CK and CKB.

The reset control unit 320 may control a reset operation of the clock generation unit 310. The reset operation may disable one or more of the clocks CK1 to CK4 for a given time so that the target clock(s) does not toggle, and then resumes toggling.

The reset control unit 320 may compare the phases of the first and second clocks CK1 and CK2, and control the clock generation unit 310 so that the second clock CK2 and the second inversion clock CK4 are disabled for a given time and then enabled when the second clock CK2 leads the first clock CK1. The reset control unit 320 may compare the phases of the first and second clocks CK1 and CK2 in several ways.

For example, the reset control unit 320 may compare the phases of the first and second clocks CK1 and CK2 by detecting the logic value of the second clock CK2 at the rising edge of the first clock CK1. The second clock CK2 may have logic low value at the rising edge of the first clock CK1 when the first clock CK1 leads the second clock CK2.

The second clock CK2 may have logic high value at the rising edge of the first clock CK1 when the second clock CK2 leads the first clock CK1. Accordingly, in the latter case, the reset control unit 320 may perform the reset operation to the clock generation unit 310 so that the second clock CK2 and the second inversion clock CK4 are disabled for a while and then enabled.

For another example, the reset control unit 320 may compare the phases of the first and second clocks CK1 and CK2 by detecting the logic value of the second inversion clock CK4 at the rising edge of the first clock CK1. As described above, the second inversion clock CK4 is inverted from the second clock CK2. When the first clock CK1 leads the second clock CK2, the second inversion clock CK4 has a logic high value at the rising edge of the first clock CK1. When the second clock CK2 leads the first clock CK1, the logic value of the second inversion clock CK4 may have a logic low value at the rising edge of the first clock CK1. Accordingly, in the latter case, the reset control unit 320 may perform the reset operation to the clock generation unit 310 so that the second clock CK2 and the second inversion clock CK4 are disabled for a given time and then enabled again.

In addition, the reset control unit 320 may compare the phases of the first and second clocks CK1 and CK2 through various ways, and perform the reset operation to the clock generation unit 310 according to the comparison result.

When the first clock CK1 leads the second clock CK2, the reset control unit 320 may control the clock generation unit 310 to keep enabling the second clock CK2 and the second inversion clock CK4.

A reference reset signal RSTB may stay low-enabled before an initialization operation of the clock generation circuit, and stay high-disabled during and after the initialization operation. The reference reset signal RSTB may stay high-disabled during the reset operation. During the initialization operation, the clock generation circuit may be activated. During the reset operation, the clock generation circuit may disable the second clock CK2 and the second inversion clock CK4 for an amount of time that is based on the comparison result and then enable them to correct the misalignment of the phase difference between the first and second clocks CK1 and CK2.

When the reference reset signal RSTB is disabled at activation of the clock generation circuit, the reset control unit 320 may control the clock generation unit 310 to enable the first clock CK1 and the first inversion clock CK3 at the rising edge of the reference clock CK and then enable the second clock CK2 and the second inversion clock CK4 at the rising edge of the reference inversion clock CKB. For example, at the activation of the clock generation circuit, an integrated circuit including the clock generation circuit is powered on. At the activation of the clock generation circuit, all of the first to fourth clocks CK1 to CK4 of the clock generation circuit may be disabled in their initial state. In this example, the reference reset signal RSTB is a high-disabled and low-enabled signal.

The reset control unit 320 may detect misalignment of the phase difference between the first and second clocks CK1 and CK2, and may correct the misalignment by disabling the second clock CK2 and the second inversion clocks CK4 for a given time based on the detection result.

For reference, the first clock CK1 may lead the second clock CK2 by the phase of 90° because the first and second clocks CK1 and CK2 are respectively generated through the 2-division of the reference clock CK and the reference inversion clock CKB. Accordingly, when the phases of the first clock CK1 and the second clock CK2 are mismatched (i.e., the second clock CK2 lead the first clock CK1 by 90°, the reset control unit 320 may correct the misalignment of the phase difference between the first and second clocks CK1 and CK2 (i.e., the first clock CK1 leads the second clock CK2 by 90°) by disabling the second clock CK2 and the second inversion clocks CK4 for a given time based on the detection result.

A detailed configuration and operation of the clock generation circuit of FIG. 3 are described below with reference to FIGS. 4 to 7.

Figure 4:
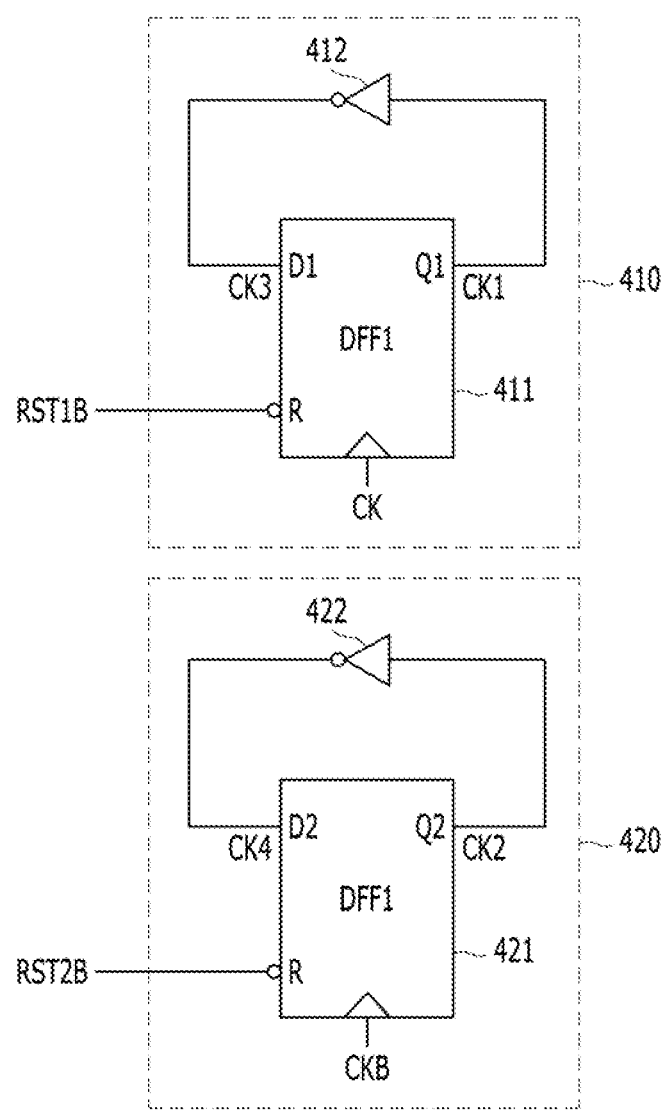
FIG. 4 is a configuration diagram illustrating a clock generation unit of FIG. 3 in accordance with an embodiment of the present invention.

FIG. 4 is a configuration diagram illustrating the clock generation unit 310 of FIG. 3 in accordance with an embodiment of the present invention.

Referring to FIG. 4, the clock generation unit 310 may include a first clock generation unit 410 and a second clock generation unit 420.

The first clock generation unit 410 may disable the first clock CK1 and the first inversion clock CK3 when a first reset signal RST1B is enabled, and may enable the first clock CK1 and the first inversion clock CK3 when the first reset signal RST1B is disabled. The first reset signal RST1B may be a high-disabled and low-enabled signal. When the first reset signal RST1B is disabled, the first clock generation unit 410 may generate the first clock CK1 through the 2-division of the reference clock CK and generate the first inversion clock CK3 by inverting the first clock CK1. When the first reset signal RST1B is enabled, the first clock generation unit 410 may low-disable the first clock CK1 and high-disable the first inversion clock CK3.

The first clock generation unit 410 may include a first D flip-flop 411 and a first inverter 412. When the first reset signal RST1B is disabled, the first D flip-flop 411 may output the logic value of a first input node D1 to a first output node Q1 at the rising edge of the clock CK. A signal of the first output node Q1 may be inverted by the first inverter 412 and input to the first input node D1. When the first reset signal RST1B is enabled, the first D flip-flop 411 may low-disable the signal of the first output node Q1, and may high-disable the signal of the first input node D1. For reference, the signal of the first output node Q1 may be the first clock CK1, and the signal of the first input node D1 may be the first inversion clock CK3.

The second clock generation unit 420 may disable the second clock CK2 and the second inversion clock CK4 when a second reset signal RST2B is enabled, and enable the second clock CK2 and the second inversion clock CK4 when the second reset signal RST2B is disabled. Similar to the first reset signal RST1B, the second reset signal RST1B may be a high-disabled and low-enabled signal. When the second reset signal RST2B is disabled, the second clock generation unit 420 may generate the second clock CK2 through the 2-division of the reference inversion clock CKB and generate the second inversion clock CK4 by inverting the second clock CK2. When the second reset signal RST2B is enabled, the second clock generation unit 420 may high-disable the second clock CK2 and low-disable the second inversion clock CK4.

The second clock generation unit 420 may include a second D flip-flop 421 and a second inverter 422. When the second reset signal RST2B is disabled, the second D flip-flop 421 may output the logic value of a second input node D2 to a second output node Q2 at the rising edge of the reference inversion clock CKB. A signal output by the second output node Q2 may be inverted by the second inverter 422 and then input to the second input node D2. When the second reset signal RST2B is enabled, the second D flip-flop 421 may high-disable the signal of the second output node Q2, and may low-disable the signal of the second input node D2. For reference, the signal of the second output node Q2 may be the second clock CK2, and the signal of the second input node D2 may be the second inversion clock CK4.

Figure 5:
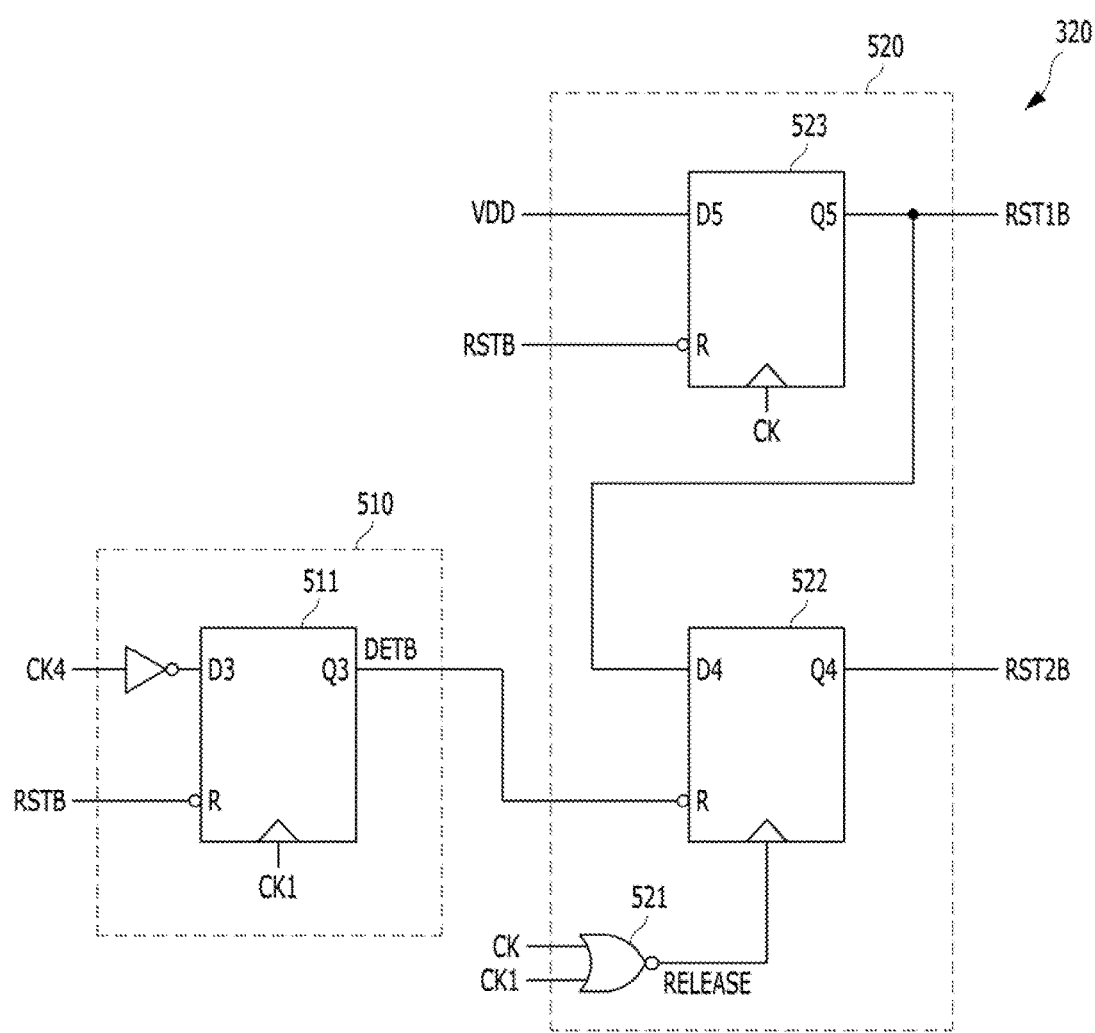
FIG. 5 is a configuration diagram illustrating a reset control unit in accordance with an embodiment of the present invention.

FIG. 5 is a configuration diagram illustrating the reset control unit 320 in accordance with an embodiment of the present invention.

Referring to FIG. 5, the reset control unit 320 may include a detection signal generation unit 510 and a reset signal generation unit 520.

The detection signal generation unit 510 may generate a detection signal DETB based on a logic value of the second clock CK2 detected at the rising edge of the first clock CK1. When the reference reset signal RSTB is enabled, the detection signal generation unit 510 may enable the detection signal DETB. The detection signal DETB may be a high-disabled and low-enabled signal. When the reference reset signal RSTB is disabled, the detection signal generation unit 510 may high-disable the detection signal DETB in response to the high-logic-valued second inversion clock CK4 or the low-logic-valued second clock CK2 at the rising edge of the first clock CK1 and may low-enable the detection signal DETB in response to the low-logic-valued second inversion clock CK4 or the high-logic-valued second clock CK2 at the rising edge of the first clock CK1.

The detection signal generation unit 510 may include a third D flip-flop 511 for outputting the low-enabled detection signal DETB through a third output node Q3 when the reference reset signal RSTB is enabled. When the reference reset signal RSTB is disabled, the detection signal generation unit 510 may output the logic value of a third input node D3 to the third output node Q3 at the rising edge of the first clock CK1. The signal of the third input node D3 may be the second inversion clock CK4 inverted from the second clock CK2, and the signal of the third output node Q3 may be the detection signal DETB. Instead of the second inversion clock CK4, the detection signal generation unit 510 may use the second clock CK2, which is the inverted version of the second inversion clock CK4, as the input to the third input node D3 with slight modification thereof.

The reset signal generation unit 520 may generate the first and the second reset signals RST1B and RST2B. When the reference reset signal RSTB is high-disabled, the reset signal generation unit 520 may high-disable the first reset signal RST1B at the rising edge of the clock CK. When the reference reset signal RSTB is low-enabled, the reset signal generation unit 520 may low-enable the first reset signal RST1B. When the detection signal DETB is low-enabled, the reset signal generation unit 520 may low-enable the second reset signal RST2B. When the detection signal DETB is high-disabled, the reset signal generation unit 520 may output the first reset signal RST1B as the second reset signal RST2B at the falling edge of the reference clock CK while the first clock CK1 has a logic low value. That is, the reset signal generation unit 520 may low-enable the second reset signal RST2B when the first reset signal RST1B is low-enabled at the falling edge of the reference clock CK while the first clock CK1 has a logic low value, and high-disable the second reset signal RST2B when the first reset signal RST1B is high-disabled at the falling edge of the reference clock CK while the first clock CK1 has a logic low value.

The reset signal generation unit 520 may include a NOR gate 521 and fourth and fifth D flip-flops 522 and 523. The NOR gate 521 may generate a release signal RELEASE by performing a NOR combination of the reference clock CK and the first clock CK1. The release signal RELEASE may toggle with the opposite phase of the reference clock CK while the first clock CK1 has a logic low value, and may have a logic low value while the first clock CK1 has a logic high value. The release signal RELEASE may have a falling edge at the rising edge of the reference clock CK while the first clock CK1 has a logic low value.

When the detection signal DETB is low-enabled, the fourth D flip-flop 522 may low-enable the second reset signal RST2B of a fourth output node Q4. When the detection signal DETB is high-disabled, the fourth D flip-flop 522 may output the logic value of the first reset signal RST1B of a fourth input node D4 to the fourth output node Q4 as the second reset signal RST2B at the rising edge of the release signal RELEASE.

When the reference reset signal RSTB is low-enabled, the fifth D flip-flop 523 may low-enable the first reset signal RST1B of a fifth output node Q5. When the reference reset signal RSTB is high-disabled, the fifth D flip-flop 523 may output a logic high value of a fifth input node D5 to the fifth output node Q5 as the high-disabled first reset signal RST1B at the rising edge of the reference clock CK.

Figure 6:
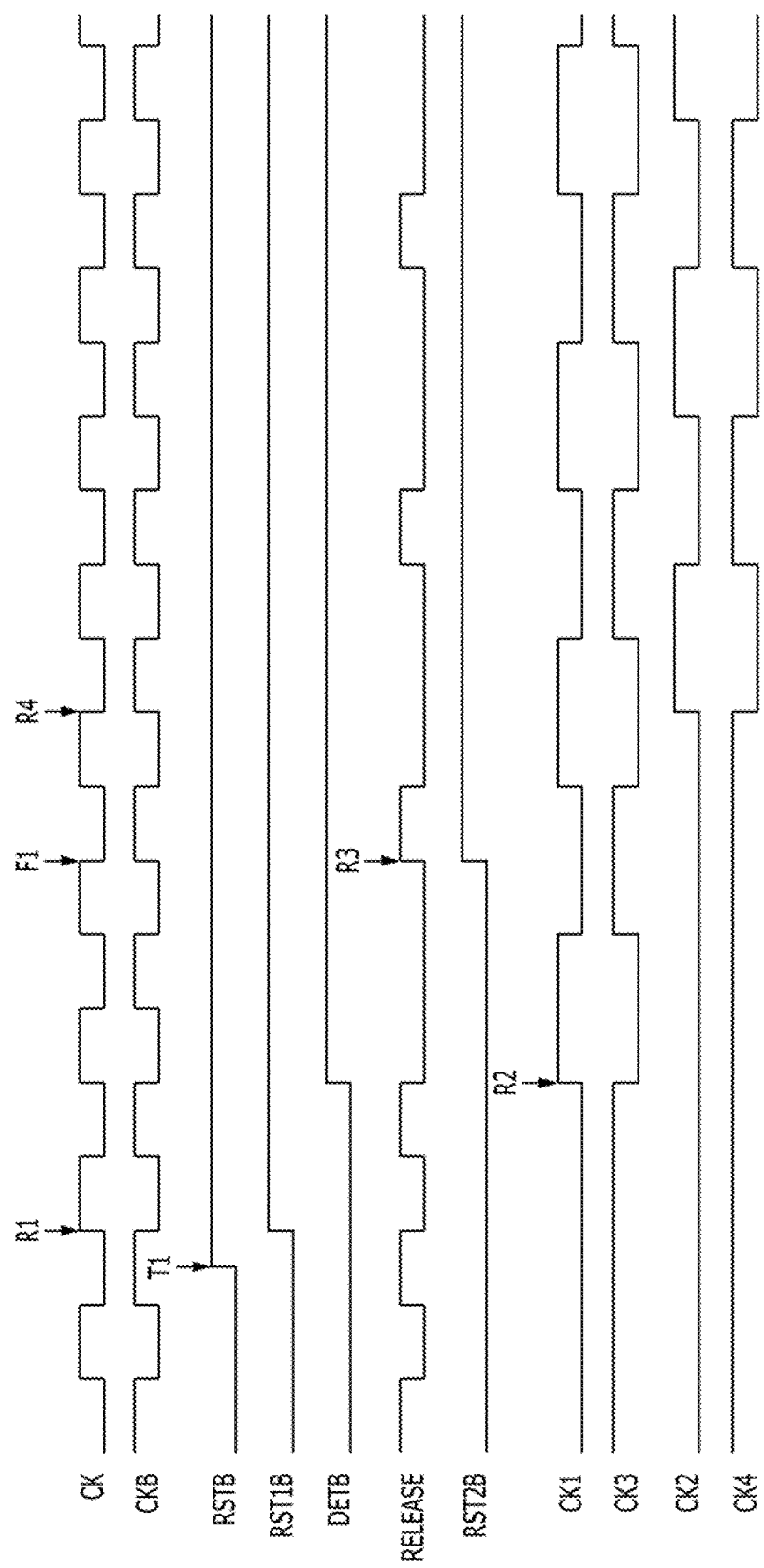
FIG. 6 is a diagram illustrating an initialization operation of a clock generation circuit of FIG. 3.

FIG. 6 is a diagram illustrating the initialization operation of the clock generation circuit of FIG. 3.

Referring to FIG. 6, the initialization operation may start from a time point T1 when the reference reset signal RSTB is low-disabled.

Before the initialization operation, the reference reset signal RSTB, the first reset signal RST1B, and the second reset signal RST2B are low-enabled. The first and the second clocks CK1 and CK2 are low-disabled, and the first and the second inversion clocks CK3 and CK4 are high-disabled. The detection signal DETB is low-enabled.

When the reference reset signal RSTB is high-disabled, at the following rising edge R1 of the reference clock CK, the first reset signal RST1B may be high-disabled. When the first reset signal RST1B is high-disabled, the first and the second clocks CK1 and CK3 may start to toggle. When the first clock CK1 starts to toggle, the detection signal DETB may be high-disabled at the following rising edge R2 of the first clock CK1.

Before enablement of the first clock CK1, the release signal RELEASE has an opposite waveform of the reference clock CK. After enablement of the first clock CK1, the release signal RELEASE has the opposite waveform of the reference clock CK only while the first clock CK1 has a logic low value.

When the detection signal DETB is high-disabled, the first reset signal RST1B at the following rising edge R3 of the release signal RELEASE may be output as the second reset signal RST2B. Accordingly, the second reset signal RST2B may be high-disabled. When the second reset signal RST2B is high-disabled, the second and the fourth clocks CK2 and CK4 may start to toggle from the following rising edge R4 of the reference inversion clock CKB. FIG. 6 shows the rising edge R3 of the release signal RELEASE corresponding to the falling edge F1 of the reference clock CK while the first clock CK1 has a logic low value.

When the initialization operation is completed, all of the reference reset signal RSTB, the first reset signal RST1B, and the second reset signal RST2B may be high-disabled, and the first to fourth clocks CK1 to CK4 may toggle with the phase difference of 90°. When the detection signal DETB is high-disabled, the second reset signal RST2B may have the value of the first reset signal RST1B at each rising edge of the release signal RELEASE. When the detection signal DETB is low-enabled, the second reset signal RST2B may be low-enabled. The release signal RELEASE has the opposite waveform of the reference clock CK only while the first clock CK1 has a logic low value.

During normal operation after the initialization operation, the clock generation circuit may continue to generate the first to fourth clocks CK1 to CK4 having correct phase differences.

Figure 7:
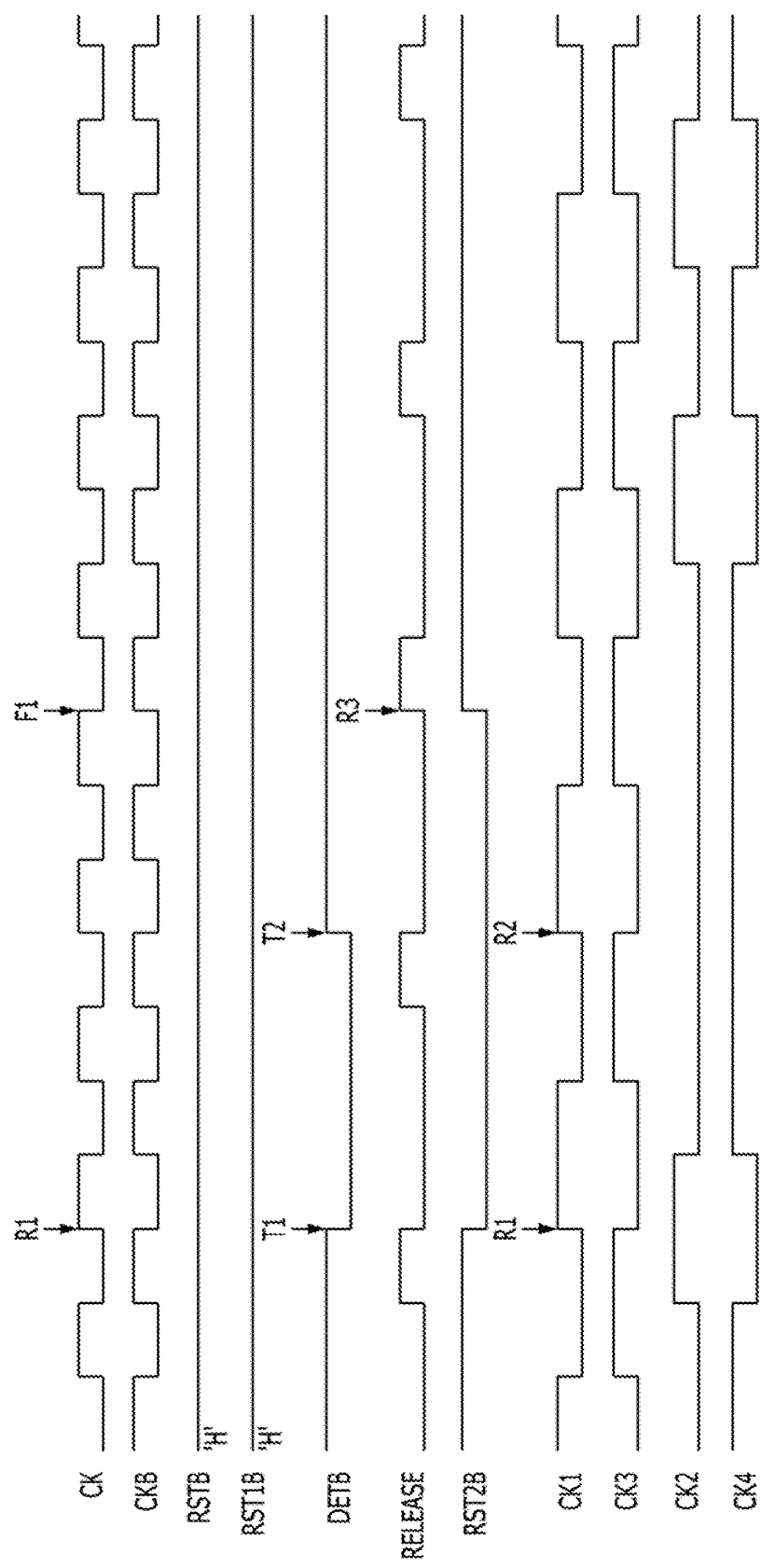
FIG. 7 is a diagram illustrating a reset operation of the clock generation circuit in accordance with the embodiments of FIGS. 3 and 6.

FIG. 7 is a diagram illustrating the reset operation of the clock generation circuit of FIG. 3.

Referring to FIG. 7, it is assumed that the phases of the first and the second clocks CK1 and CK2 are distorted due to noise at a specific time point. FIG. 7 illustrates an example in which the second clock CK2 leads the first clock CK1 by the phase amount of 90° according to the phase distortion.

The detection signal DETB is low-enabled at a time point T1 because the logic value of the second clock CK2 (or the second inversion clock CK4) is detected as high (or low) at the rising edge R1 of the first clock CK1. When the detection signal DETB is low-enabled, the second reset signal RST2B may become low-enabled and thus the second clock CK2 and the second inversion clock CK4 may become disabled respectively to have logic low and high values. During the disablement of the second clock CK2 and the second inversion clock CK4, the operation of detecting the logic value of the second clock CK2 (or the second inversion clock CK4) at the rising edge of the first clock CK1 continues. Accordingly, when the logic value of the second clock CK2 (or the second inversion clock CK4) is detected as low (or high) at the rising edge R2 of the first clock CK1, the detection signal DETB is high-disabled at a time point T2. After the detection signal DETB becomes high-disabled, the high-disabled ("H") first reset signal RST1B may be outputted as the second reset signal RST2B at the first rising edge R3 of the release signal RELEASE, which corresponds to the falling edge F1 of the reference clock CK during logic low of the first clock CK1. Accordingly, the second reset signal RST2B may become high-disabled, and the second clock CK2 and the second inversion clock CK4 may become enabled again.

Therefore, the phase relationship between the first and the second clocks CK1 and CK2 may be recovered through the reset operation.

Figure 8:
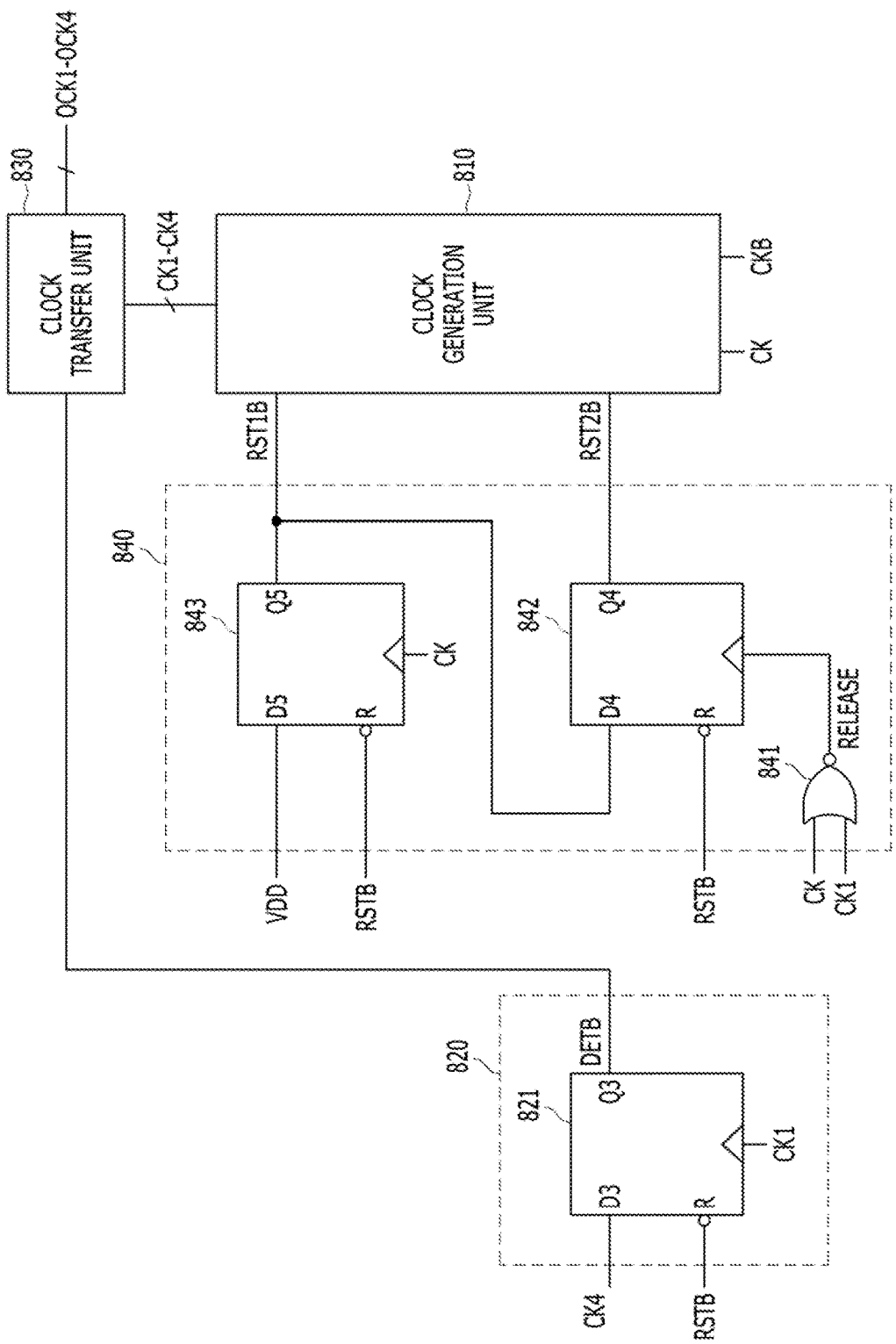
FIG. 8 is a configuration diagram illustrating a clock generation circuit in accordance with another embodiment of the present invention.

FIG. 8 is a configuration diagram illustrating a clock generation circuit in accordance with another embodiment of the present invention.

Referring to FIG. 8, the clock generation circuit may include a clock generation unit 810, a phase comparison unit 820, a clock transfer unit 830, and a reset signal generation unit 840.

The clock generation unit 810 and the phase comparison unit 820 may be the same as the clock generation unit 310 and the detection signal generation unit 510 described with reference to FIGS. 3 to 7.

The reset signal generation unit 840 may be the same as the reset signal generation unit 520 described with reference to FIGS. 5 to 7 except that the reset signal generation unit 840 receives the reference reset signal RSTB instead of the detection signal DETB of the phase comparison unit 820.

The reset signal generation unit 840 may generate the first and the second reset signals RST1B and RST2B. When the reference reset signal RSTB is high-disabled, the reset signal generation unit 840 may high-disable the first reset signal RST1B at the rising edge of the clock CK. When the reference reset signal RSTB is low-enabled, the reset signal generation unit 840 may low-enable the first reset signal RST1B. When the reference reset signal RSTB is low-enabled, the reset signal generation unit 840 may low-enable the second reset signal RST2B. When the reference reset signal RSTB is high-disabled, the reset signal generation unit 840 may output the first reset signal RST1B as the second reset signal RST2B at the falling edge of the reference clock CK while the first clock CK1 has a logic low value. That is, the reset signal generation unit 840 may low-enable the second reset signal RST2B when the first reset signal RST1B is low-enabled at the falling edge of the reference clock CK while the first clock CK1 has a logic low value, and high-disable the second reset signal RST2B when the first reset signal RST1B is high-disabled at the falling edge of the reference clock CK while the first clock CK1 has a logic low value.

As described above, the reference reset signal RSTB may stay low-enabled before an initialization operation of the clock generation circuit, and stay high-disabled during and after the initialization operation. The reference reset signal RSTB may stay high-disabled during the reset operation. During the initialization operation, the clock generation circuit may be activated. During the reset operation, the clock generation circuit may disable the second clock CK2 and the second inversion clock CK4 for an amount of time based on the comparison result and then enable them in order to correct the misalignment of the phase difference between the first and second clocks CK1 and CK2.

The reset signal generation unit 840 may include a NOR gate 841 and fourth and fifth D flip-flops 842 and 843. The a NOR gate 841 and fourth and fifth D flip-flops 842 and 843 may be the same as the NOR gate 521 and fourth and fifth D flip-flops 522 and 523 described with reference to FIGS. 5 to 7 except that the fourth D flip-flop 842 receives the reference reset signal RSTB instead of the detection signal DETB of the phase comparison unit 820.

When the reference reset signal RSTB is low-enabled, the fourth D flip-flop 842 may low-enable the second reset signal RST2B of the fourth output node Q4. When the reference reset signal RSTB is high-disabled, the fourth D flip-flop 842 may output the logic value of the first reset signal RST1B of the fourth input node D4 to the fourth output node Q4 as the second reset signal RST2B at the rising edge of the release signal RELEASE.

The clock transfer unit 830 may transfer the first clock CK1, the second clock CK2, the first inversion clock CK3, and the second inversion clock CK4 as first to fourth output clocks OCK1 to OCK4 according to the detection signal DETB of the phase comparison unit 810. The first to fourth output clocks OCK1 to OCK4 may have a phase difference of 90°. The first output clock OCK1 may have a phase of 0°, the second output clock OCK2 may have a phase of 90°, the third output clock OCK3 may have a phase of 180°, and the fourth output clock OCK4 may have a phase of 270°. The first to fourth output clocks OCK1 to OCK4 may respectively represent the first clock CK1, the second clock CK2, the first inversion clock CK3, and the second inversion clock CK4 having the correct phase differences.

When the detection signal DETB is high-disabled, which means correct phase differences among the clocks CK1 to CK4, the clock transfer unit 830 may output the first clock CK1 as the first output clock OCK1, may output the second clock CK2 as the second output clock OCK2, may output the first inversion clock CK3 as the third output clock OCK3, and may output the second inversion clock CK4 as the fourth output clock CK4. When the detection signal DETB is low-enabled, which means distortion of phase differences among the clocks CK1 to CK4, the clock transfer unit 830 may output the first to fourth output clocks OCK1 to OCK4 respectively representing the first clock CK1, the second clock CK2, the first inversion clock CK3, and the second inversion clock CK4 having the correct phase differences.

Two examples will be described as follows among various ways to output the first to fourth output clocks OCK1 to OCK4 respectively representing the first clock CK1, the second clock CK2, the first inversion clock CK3, and the second inversion clock CK4 having the correct phase differences. The examples assume that the distortion of phase differences makes the second clock CK2 to lead the first clock CK1 by the phase amount of 90°.

In a first example, when the detection signal DETB is low-enabled, the clock transfer unit 830 may output the first inversion clock CK3 as the first output clock OCK1, may output the second clock CK2 as the second output clock OCK2, may output the first clock CK1 as the third output clock OCK3, and may output the second inversion clock CK4 as the fourth output clock OCK4. That is, the clock transfer unit 830 may correct the phase differences among the clocks CK1 to CK4 by selectively reordering the phase-distorted clocks CK1 to CK4. Accordingly, the clock transfer unit 830 may output the first to fourth output clocks OCK1 to OCK4 respectively representing the first clock CK1, the second clock CK2, the first inversion clock CK3, and the second inversion clock CK4 having the correct phase differences.

In a second example, when the detection signal DETB is low-enabled, the clock transfer unit 830 may output the first clock CK1 as the first output clock OCK1, may output the second inversion clock CK4 as the second output clock OCK2, may output the first inversion clock CK3 as the third output clock OCK3, and may output the second clock CK2 as the fourth output clock OCK4. That is, similar to the first example, the clock transfer unit 830 may correct the phase differences among the clocks CK1 to CK4 by selectively reordering the phase-distorted clocks CK1 to CK4. Accordingly, the clock transfer unit 830 may output the first to fourth output clocks OCK1 to OCK4 respectively representing the first clock CK1, the second clock CK2, the first inversion clock CK3, and the second inversion clock CK4 having the correct phase differences.

The clock transfer unit 830 may correct the phase differences among the clocks CK1 to CK4 by selectively reordering the phase-distorted clocks CK1 to CK4 based on a result of a comparison between the phases of the first and second clocks CK1 and CK2 so that the first to fourth output clocks OCK1 to OCK4 may respectively represent the first clock CK1, the second clock CK2, the first inversion clock CK3, and the second inversion clock CK4 having the correct phase differences.

A detailed configuration and operation of the clock generation circuit of FIG. 8 are described below with reference to FIGS. 9 to 12.

Figure 9:
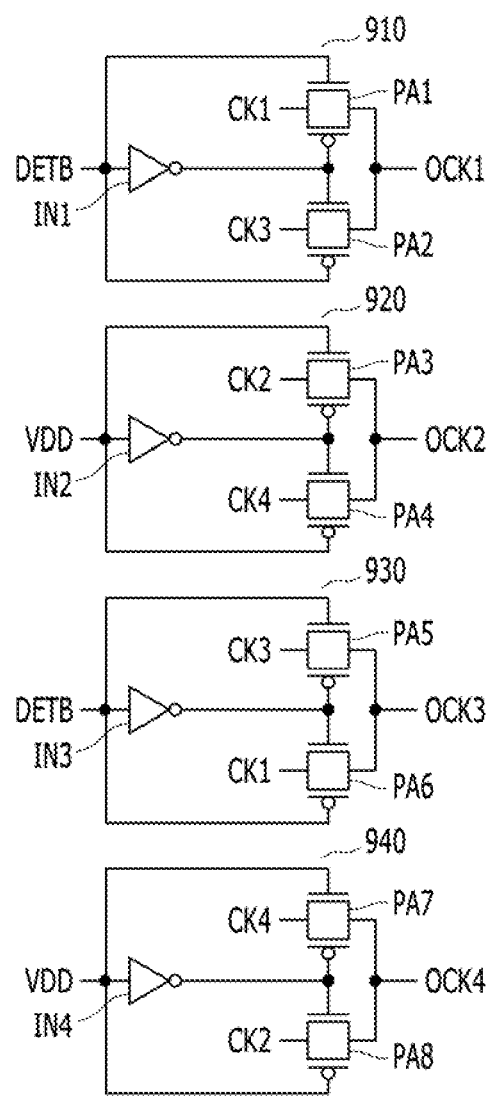
FIG. 9 is a configuration diagram illustrating a first example of a clock transfer unit of FIG. 8.

FIG. 9 is a configuration diagram illustrating the first example of the clock transfer unit 830 of FIG. 8. Referring to FIG. 9, the clock transfer unit 830 may include first to fourth transfer units 910 to 940.

The first transfer unit 910 may transfer the first clock CK1 as the first output clock OCK1 when the detection signal DETB is disabled and transfer the first inversion clock CK3 as the third output clock OCK3 when the detection signal DETB is enabled. The first transfer unit 910 may include an inverter IV1 and pass gates PA1 and PA2.

The second transfer unit 920 may transfer the second clock CK2 as the second output clock OCK2 regardless of the logic value of the detection signal DETB. The second transfer unit 920 may include an inverter IV2 and pass gates PA3 and PA4.

The third transfer unit 930 may transfer the first inversion clock CK3 as the third output clock OCK3 when the detection signal DETB is disabled and transfer the first clock CK1 as the third output clock OCK3 when the detection signal DETB is enabled. The third transfer unit 930 may include an inverter IV3 and pass gates PA5 and PA6.

The second transfer unit 940 may transfer the second inversion clock CK4 as the second output clock OCK4 regardless of the logic value of the detection signal DETB. The fourth transfer unit 940 may include an inverter IV4 and pass gates PA7 and PA8.

Figure 10:
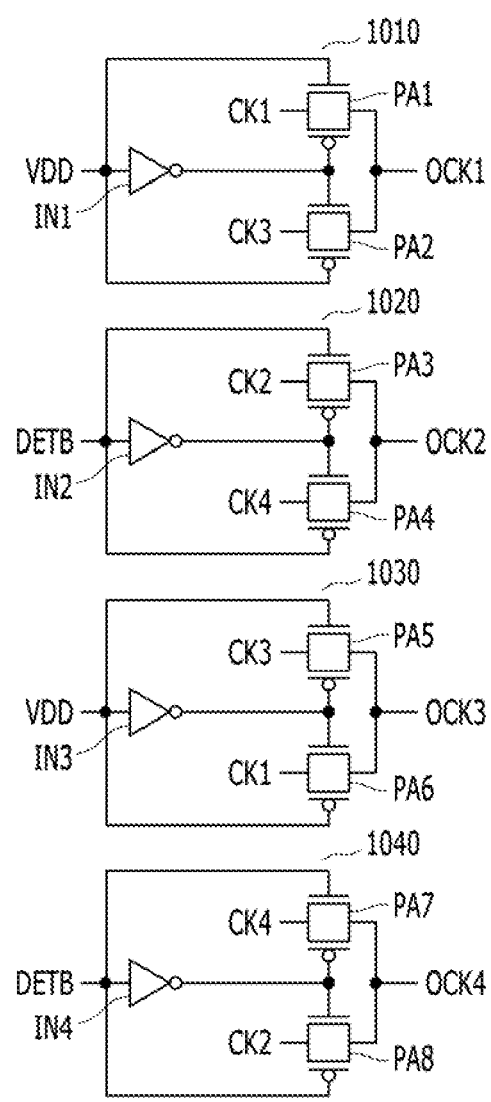
FIG. 10 is a configuration diagram illustrating a second example of a clock transfer unit of FIG. 8.

FIG. 10 is a configuration diagram illustrating the second example of the clock transfer unit 830 of FIG. 8. Referring to FIG. 10, the clock transfer unit 830 may include first to fourth transfer units 1010 to 1040.

The first transfer unit 1010 may transfer the first clock CK1 as the first output clock OCK1 regardless of the logic value of the detection signal DETB. The first transfer unit 1020 may include an inverter IV1 and pass gates PA1 and PA1.

The second transfer unit 1020 may transfer the second clock CK2 as the second output clock OCK2 when the detection signal DETB is disabled and transfer the second inversion clock CK4 as the second output clock OCK2 when the detection signal DETB is enabled. The second transfer unit 1020 may include an inverter IV2 and pass gates PA3 and PA4.

The third transfer unit 1030 may transfer the first inversion clock CK3 as the third output clock OCK3 regardless of the logic value of the detection signal DETB. The third transfer unit 1030 may include an inverter IV3 and pass gates PA5 and PA6.

The fourth transfer unit 1040 may transfer the second inversion clock CK4 as the fourth output clock OCK4 when the detection signal DETB is disabled and transfer the second clock CK2 as the fourth output clock OCK4 when the detection signal DETB is enabled. The fourth transfer unit 1040 may include an inverter IV4 and pass gates PA7 and PA8.

Figure 11:
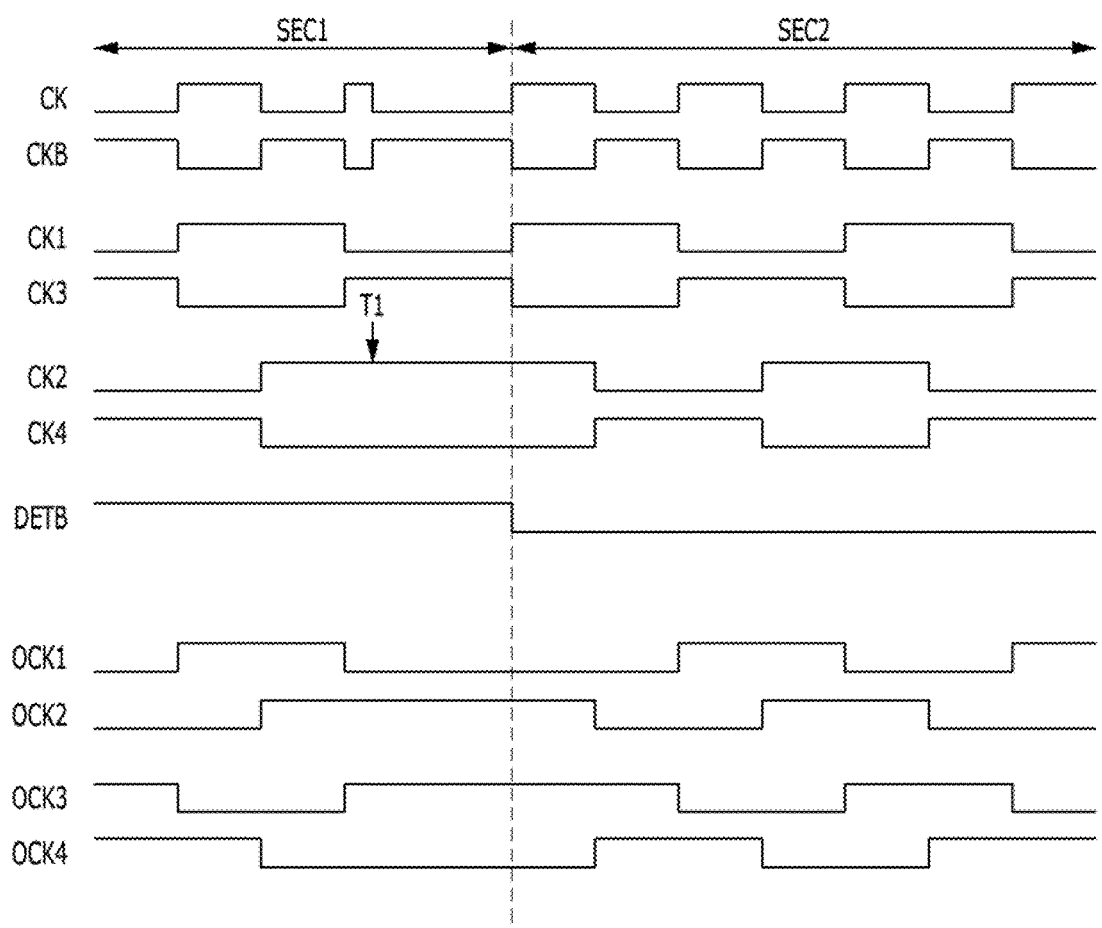
FIG. 11 is a diagram illustrating an operation of a clock generation circuit including a first example of a clock transfer unit of FIGS. 8 and 9.

FIG. 11 is a diagram illustrating an operation of the clock generation circuit including the first example of the clock transfer unit 830 of FIGS. 8 and 9.

Referring to FIG. 11, during a section SEC1 in which the detection signal DETB is high-disabled, the first to fourth clocks CK1 to CK4 may be respectively outputted as the first to fourth output clocks OCK1 to OCK4, and the first to fourth output clocks OCK1 to OCK4 may maintain respective phases of 0°, 90°, 180°, and 270°. When the second clocks CK2 and CK4 do not shift at T1 due to noise of the clock CK and the reference inversion clock CKB, the phase relationships between the first to fourth output clocks OCK1-OCK4 may be mismatched.

In this case, when the mismatched phase relationship between the first clock CK1 and the second clock CK2 is detected, the detection signal DETB may be low-enabled. In section SEC2 in which the detection signal DETB is low-enabled, the first clock CK1 may be outputted as the third output clock OCK3, the second clock CK2 may be outputted as the second output clock OCK2, the first inversion clock CK3 may be outputted as the first output clock OCK1, and the second inversion clock CK4 may be outputted as the fourth output clock OCK4. Accordingly, the first to fourth output clocks OCK1 to OCK4 maintain the respective phases of 0°, 90°, 180°, and 270°.

Figure 12:
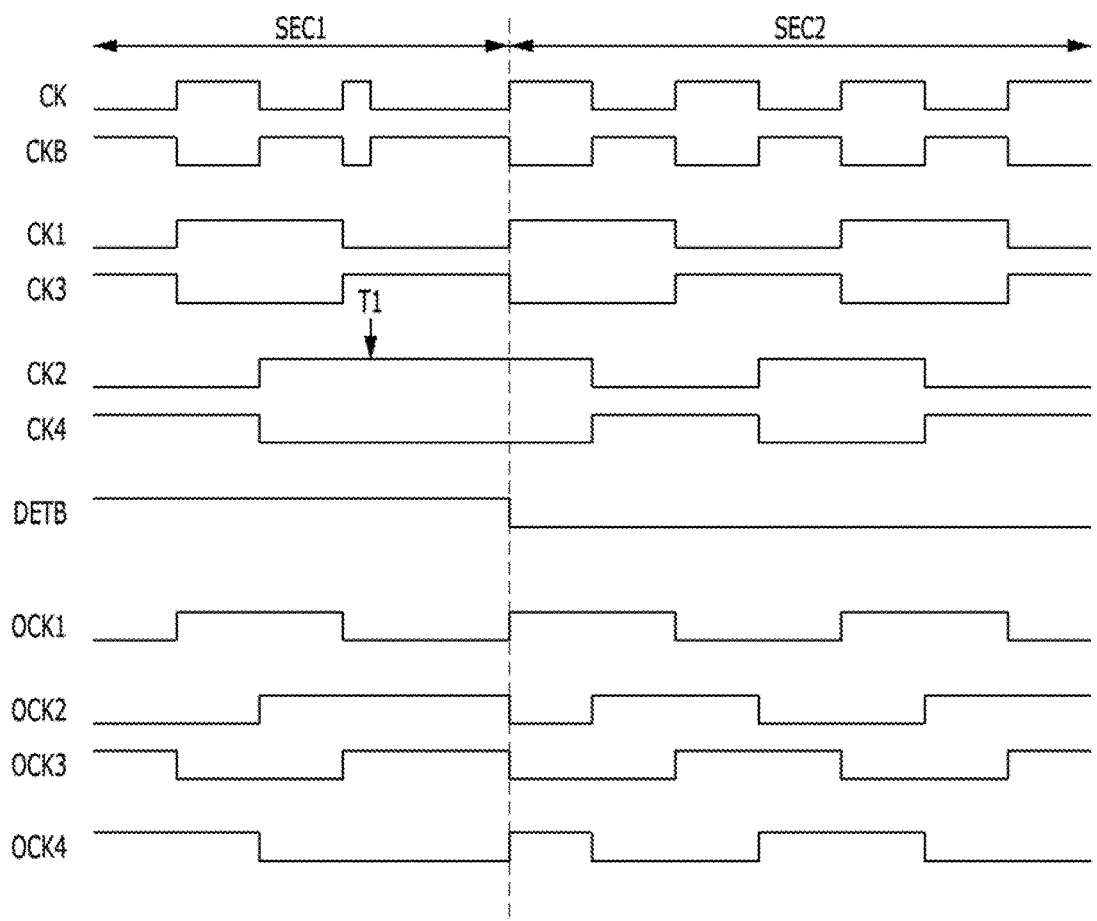
FIG. 12 is a diagram illustrating an operation of a clock generation circuit including a second example of a clock transfer unit of FIGS. 8 and 10.

FIG. 12 is a diagram illustrating an operation of the clock generation circuit including the second example of the clock transfer unit 830 of FIGS. 8 and 10.

Referring to FIG. 12, during a section SEC1 in which the detection signal DETB is high-disabled, the first to fourth clocks CK1 to CK4 may be respectively outputted as the first to fourth output clocks OCK1 to OCK4, and the first to fourth output clocks OCK1 to OCK4 may maintain respective phases of 0°, 90°, 180°, and 270°. When the second clocks CK2 and CK4 do not shift at T1 due to noise of the reference clock CK and the reference inversion clock CKB, the phase relationships between the first to fourth output clocks OCK1 to OCK4 are mismatched.

In this case, when the mismatched phase relationship between the first clock CK1 and the second clock CK2 is detected, the detection signal DETB may be low-enabled. In a section SEC2 in which the detection signal DETB is low-enabled, the first clock CK1 may be outputted as the first output clock OCK1, the second clock CK2 may be outputted as the fourth output clock OCK4, the first inversion clock CK3 may be outputted as the third output clock OCK3, and the second inversion clock CK4 may be outputted as the second output clock OCK2. Accordingly, the first to fourth output clocks OCK1 to OCK4 maintain the respective phases of 0°, 90°, 180°, and 270°.

In this technology, the clock generation circuit performs a comparison between the phases of clocks having multiple phases and initializes some of the clocks or changes the order of some of the clocks when the order of the phases is different from what it is intended. Accordingly, the order of the phases of clocks having multiple phases can be maintained as intended although it has been disrupted due to noise.

Although various embodiments have been described for illustrative purposes, it will be apparent to those skilled in the art that various changes and modifications may be made without departing from the spirit and scope of the invention as defined in the following claims.

What is claimed is:

1. A clock generation circuit, comprising:
   a clock generation unit suitable for generating a first clock, a first inversion clock having an opposite phase to the first clock, a second clock having a different phase from the first clock, and a second inversion clock having an opposite phase to the second clock;
   a phase comparison unit suitable for comparing the phases of the first and second clocks; and
   a clock transfer unit suitable for transferring the first clock, the second clock, the first inversion clock, and the second inversion clock as first to fourth output clocks in accordance with a relationship based on the comparison result.

2. The clock generation circuit of claim 1, wherein when the first clock leads the second clock, the clock transfer unit transfers the first clock as the first output clock, transfers the second clock as the second output clock, transfers the first inversion clock as the third output clock, and transfers the second inversion clock as the fourth output clock,
   wherein when the second clock leads the first clock, the clock transfer unit transfers the first inversion clock as the first output clock, transfers the second clock as the second output clock, transfers the first clock as the third output clock, and transfers the second inversion clock as the fourth output clock.

3. The clock generation circuit of claim 1, wherein when the first clock leads the second clock, the clock transfer unit transfers the first clock as the first output clock, transfers the second clock as the second output clock, transfers the first inversion clock as the third output clock, and transfers the second inversion clock as the fourth output clock,
   when the second clock leads the first clock, the clock transfer unit transfers the first clock as the first output clock, transfers the second inversion clock as the second output clock, transfers the first inversion clock as the third output clock, and transfers the second clock as the fourth output clock.

4. The clock generation circuit of claim 1, wherein the clock transfer unit outputs the first to fourth output clocks so that the second output clock lags behind the first output clock, the third output clock lags behind the second output clock, and the fourth output clock lags behind the third output clock, each by a phase amount of 90°.

5. The clock generation circuit of claim 1, wherein the clock generation unit includes:
   a first clock generation unit suitable for generating the first clock by dividing a reference clock by 2 and generating the first inversion clock by inverting the first clock; and
   a second clock generation unit suitable for generating the second clock by dividing a reference inversion clock, which has an opposite phase to the reference clock, by 2 and generating the second inversion clock by inverting the second clock.

6. The clock generation circuit of claim 1, wherein phase comparison unit comparing the phases of the first and second clocks by detecting a logic value of either the second clock or the second inversion clock at an edge of the first clock to generate a detection signal.

7. The clock generation circuit of claim 6, wherein:
   when the logic value of either the second clock or the second inversion clock is a first logic value, the clock transfer unit transfers the first clock as the first output clock, transfers the second clock as the second output clock, transfers the first inversion clock as the third output clock, and transfers the second inversion clock as the fourth output clock; and
   when the logic value of either the second clock or the second inversion clock is a second logic value, the clock transfer unit transfers the first inversion clock as the first output clock, transfers the second clock as the second output clock, transfers the first clock as the third output clock, and transfers the second inversion clock as the fourth output clock.

8. The clock generation circuit of claim 7, wherein the clock transfer unit includes:
   a first transfer unit suitable for transferring the first clock as the first output clock when the detection signal is disabled and transferring the first inversion clock as the first output clock when the detection signal is enabled;
   a second transfer unit suitable for transferring the second clock as the second output clock regardless of the detection signal;
   a third transfer unit suitable for transferring the first inversion clock as the third output clock when the detection signal is disabled and transferring the first clock as the third output clock when the detection signal is enabled; and
   a fourth transfer unit suitable for transferring the second inversion clock as the fourth output clock regardless of the detection signal.

9. The clock generation circuit of claim 6, wherein:
   when the logic value of either the second clock or the second inversion clock is a first logic value, the clock transfer unit transfers the first clock as the first output clock, transfers the second clock as the second output clock, transfers the first inversion clock as the third output clock, and transfers the second inversion clock as the fourth output clock; and when the logic value of either the second clock or the second inversion clock is a second logic value, the clock transfer unit transfers the first clock as the first output clock, transfers the second inversion clock as the second output clock, transfers the first inversion clock as the third output clock, and transfers the second clock as the fourth output clock.

10. The clock generation circuit of claim 9, wherein the clock transfer unit includes:
- a first transfer unit suitable for transferring the first clock as the first output clock regardless of the detection signal;
- a second transfer unit suitable for transferring the second clock as the second output clock when the detection signal is disabled and transferring the second inversion clock as the second output clock when the detection signal is enabled;
- a third transfer unit suitable for transferring the first inversion clock as the third output clock regardless of the detection signal; and
- a fourth transfer unit suitable for transferring the second inversion clock as the fourth output clock when the detection signal is disabled and transferring the second clock as the fourth output clock when the detection signal is enabled.

* * * * *